(12) United States Patent
Joshi et al.

(10) Patent No.: US 7,807,225 B2
(45) Date of Patent: Oct. 5, 2010

(54) HIGH DENSITY PLASMA NON-STOICHIOMETRIC SIOXNY FILMS

(75) Inventors: Pooran Chandra Joshi, Vancouver, WA (US); Apostolos T. Voutsas, Portland, OR (US); John W. Hartzell, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 918 days.

(21) Appl. No.: 11/698,623

(22) Filed: Jan. 26, 2007

(65) Prior Publication Data

US 2007/0155137 A1 Jul. 5, 2007

Related U.S. Application Data

(63) Continuation-in-part of application No. 11/418,273, filed on May 4, 2006, now Pat. No. 7,544,625, which is a continuation-in-part of application No. 11/327,612, filed on Jan. 6, 2006, and a continuation-in-part of application No. 11/139,726, filed on May 26, 2005, now Pat. No. 7,381,595, and a continuation-in-part of application No. 10/871,939, filed on Jun. 17, 2004, now Pat. No. 7,186,663, which is a continuation-in-part of application No. 10/801,374, filed on Mar. 15, 2004, now Pat. No. 7,087,537, and a continuation-in-part of application No. 10/801,377, filed on Mar. 15, 2004, now Pat. No. 7,122,487, and a continuation-in-part of application No. 10/812,591, filed on Mar. 29, 2004, now Pat. No. 7,122,488, and a continuation-in-part of application No. 11/013,605, filed on Dec. 15, 2004, now Pat. No. 7,446,023.

(51) Int. Cl.
*C23C 16/00* (2006.01)

(52) U.S. Cl. .................. 427/255.394; 427/569

(58) Field of Classification Search ........... None
See application file for complete search history.

(56) References Cited

U.S. PATENT DOCUMENTS

| | | | | |
|---|---|---|---|---|
| 4,727,044 A | * | 2/1988 | Yamazaki | 438/166 |
| 6,157,047 A | | 12/2000 | Fujita et al. | 257/51 |
| 6,493,496 B2 | | 12/2002 | Nagata | 385/129 |

(Continued)

OTHER PUBLICATIONS

Gritsenko, J. Non-Crystalline Solids, V297 (2002), p. 96-101.*

*Primary Examiner*—Bret Chen
*Assistant Examiner*—Joseph Miller, Jr.
(74) *Attorney, Agent, or Firm*—Law Office of Gerald Maliszewski; Gerald Maliszewski (57) ABSTRACT

A high-density plasma method is provided for forming a $SiO_XN_Y$ thin-film. The method provides a substrate and introduces a silicon (Si) precursor. A thin-film is deposited overlying the substrate, using a high density (HD) plasma-enhanced chemical vapor deposition (PECVD) process. As a result, a $SiO_XN_Y$ thin-film is formed, where (X+Y<2 and Y>0). The $SiO_XN_Y$ thin-film can be stoichiometric or non-stoichiometric. The $SiO_XN_Y$ thin-film can be graded, meaning the values of X and Y vary with the thickness of the $SiO_XN_Y$ thin-film. Further, the process enables the in-situ deposition of a $SiO_XN_Y$ thin-film multilayer structure, where the different layers may be stoichiometric, non-stoichiometric, graded, and combinations of the above-mentioned types of $SiO_XN_Y$ thin-films.

35 Claims, 5 Drawing Sheets

U.S. PATENT DOCUMENTS

| | | |
|---|---|---|
| 6,890,656 B2 | 5/2005 | Iacovangelo et al. ........ 428/412 |
| 2001/0019903 A1* | 9/2001 | Shufflebotham et al. .... 438/788 |
| 2001/0052394 A1* | 12/2001 | Jung et al. ................... 156/345 |
| 2002/0012876 A1* | 1/2002 | Angelopoulos et al. .. 430/271.1 |
| 2002/0094593 A1* | 7/2002 | Chiou et al. ................... 438/29 |
| 2002/0137333 A1* | 9/2002 | Kirchhoff ................... 438/677 |
| 2002/0155708 A1* | 10/2002 | Lo et al. ...................... 438/689 |
| 2003/0110808 A1* | 6/2003 | M'Saad et al. ................ 65/379 |
| 2003/0203515 A1* | 10/2003 | Lin et al. ........................ 438/8 |
| 2004/0058499 A1* | 3/2004 | Ishitsuka et al. ............ 438/296 |
| 2004/0062945 A1 | 4/2004 | Domash et al. ............. 428/641 |
| 2005/0058416 A1 | 3/2005 | Hoon Lee et al. ........... 385/122 |

* cited by examiner

Fig. 3B HDP nc-Si EMBEDDED SiOx THIN FILMS: OPTICAL DISPERSION

Fig. 4A PL INTENSITY vs ANNEALING TEMPERATURE: HDP NanoSi15

HIGH DENSITY PLASMA NON-STOICHIOMETRIC SIOXNY FILMS

RELATED APPLICATIONS

This application is a continuation-in-part of a patent application entitled, SILICON OXIDE THIN-FILMS WITH EMBEDDED NANOCRYSTALLINE SILICON, invented by Tingkai Li et al., Ser. No. 11/418,273, filed May 4, 2006 now U.S. Pat. No. 7,544,625;

which is a continuation-in-part of the following three pending patent applications:

ENHANCED THIN-FILM OXIDATION PROCESS, invented by Pooran Joshi et al., Ser. No. 11/327,612, filed Jan. 6, 2006;

HIGH-DENSITY PLASMA OXIDATION FOR ENHANCED GATE OXIDE PERFORMANCE, invented by Joshi et al., Ser. No. 11/139,726, filed May 26, 2005 now U.S. Pat. No. 7,381,595; and, HIGH-DENSITY PLASMA PROCESS FOR SILICON THIN-FILMS, invented by Pooran Joshi, Ser. No. 10/871,939, filed Jun. 17, 2004 now U.S. Pat. No. 7,186,663;

which is a continuation-in-part of the following three issued patents:

METHOD FOR FABRICATING OXIDE THIN-FILMS, invented by Joshi et al., Ser. No. 10/801,374, filed Mar. 15, 2004, U.S. Pat. No. 7,087,537, issued Aug. 8, 2006;

DEPOSITION OXIDE WITH IMPROVED OXYGEN BONDING, invented by Pooran Joshi, Ser. No. 10/801,377, filed Mar. 15, 2004, U.S. Pat. No. 7,122,487, issued Oct. 17, 2006; and, HIGH DENSITY PLASMA PROCESS FOR THE FORMATION OF SILICON DIOXIDE ON SILICON CARBIDE SUBSTRATES, invented by Joshi et al., Ser. No. 10/812,591, filed Mar. 29, 2004, U.S. Pat. No. 7,122,488, issued Oct. 17, 2006;

The instant application is also a continuation-in-part of a patent application entitled, HIGH-DENSITY PLASMA HYDROGENATION, invented by Pooran Joshi et al., Ser. No. 11/013,605, filed Dec. 15, 2004 now U.S. Pat. No. 7,446,023.

All of the above-mentioned applications are incorporated herein by reference.

BACKGROUND OF THE INVENTION

1. Field of the Invention

This invention generally relates to the fabrication of integrated circuit (IC) devices, and more particularly, to a method for forming a non-stoichiometric silicon-oxide-nitride film, using a high-density plasma-enhanced chemical vapor deposition process.

2. Description of the Related Art

The fabrication of integrated optical devices involves the deposition of materials with the optical characteristics such as absorption, transmission, and spectral response. Thin-film fabrication techniques can produce diverse optical thin films, which are suitable for the production of large area devices at high throughput and yield. Some optical parameters of importance include refractive index and the optical band-gap, which dictate the transmission and reflection characteristics of the thin film.

Typically, bilayer or multilayer stack thin-films are required for the fabrication of optical devices. Various combinations of the metal, dielectric, and/or semiconductor layers are used to form multilayer films. The selection of the material depends on the target reflection, transmission, and absorption characteristics. While a single layer device would obviously be more desirable, no single thin-film material can provide the wide range of optical dispersion characteristics required to get the desired optical absorption, reflection, or transmission over a wide optical range extending from UV to far IR frequencies.

Silicon is the material of choice for the fabrication of optoelectronic devices because of well-developed processing technology. However, the indirect band-gap makes it an inefficient material for optoelectronic devices. Over the years, various R&D efforts have focused on tailoring the optical function of Si to realize Si-based optoelectronics. The achievement of efficient room temperature light emission from the crystalline silicon is a major step towards the achievement of fully Si-based optoelectronics.

The fabrication of stable and reliable optoelectronic devices requires Si nanocrystals with high photoluminescence (PL) and electroluminescence (EL) quantum efficiency. One approach that is being actively pursued for integrated optoelectronic devices is the fabrication of $SiO_x$ ($x \leq 2$) thin films with embedded Si nanocrystals. The luminescence due to recombination of the electron-hole pairs confined in Si nanocrystals depends strongly on the nanocrystal size. The electrical and optical properties of the nanocrystalline Si embedded $SiO_x$ thin films depend on the size, concentration, and distribution of the Si nanocrystals. Various thin-film deposition techniques such as sputtering and plasma-enhanced chemical vapor deposition (PECVD), employing capacitively-coupled plasma source, are being investigated for the fabrication of stable and reliable nanocrystalline Si thin films.

However, conventional PECVD and sputtering techniques have the limitations of low plasma density, inefficient power coupling to the plasma, low ion/neutral ratio, and uncontrolled bulk, and interface damage due to high ion bombardment energy. Therefore, the oxide films formed from a conventional capacitively-coupled plasma (CCP) generated plasma may create reliability issues due to the high bombardment energy of the impinging ionic species. It is important to control or minimize any plasma-induced bulk or interface damage. However, it is not possible to control the ion energy using radio frequency (RF) of CCP generated plasma. Any attempt to enhance the reaction kinetics by increasing the applied power results in increased bombardment of the deposited film, which creates a poor quality films with a high defect concentration. Additionally, the low plasma density associated with these types of sources ($\sim 1 \times 10^8$-$10^9$ $cm^{-3}$) leads to limited reaction possibilities in the plasma and on the film surface, inefficient generation of active radicals for enhanced process kinetics, inefficient oxidation, and reduction of impurities at low thermal budgets, which limits their usefulness in the fabrication of low-temperature electronic devices.

A deposition process that offers a more extended processing range and enhanced plasma characteristics than conventional plasma-based techniques, such as sputtering, PECVD, etc., is required to generate and control the particle size for PL and electroluminescent (EL) based device development. A process that can enhance plasma density and minimize plasma bombardment will ensure the growth of high quality films without plasma-induced microstructural damage. A process that can offer the possibility of controlling the interface and bulk quality of the films independently will enable the fabrication of high performance and high reliability electronic devices. A plasma process that can efficiently generate the active plasma species, radicals and ions, will enable noble thin film development with controlled process and property control.

For the fabrication of high quality SiOx thin films, the oxidation of the growing film is also critical to ensure high quality insulating layer across the nanocrystalline Si particles. A process that can generate active oxygen radicals at high concentrations will ensure effective passivation of the Si nanoparticles in the oxide matrix surrounding it. A plasma process that can minimize plasma-induced damage will enable the formation of a high quality interface that is critical for the fabrication of high quality devices. Low thermal budget efficient oxidation and hydrogenation processes are critical and will be significant for the processing of high quality optoelectronic devices. The higher temperature thermal processes can interfere with the other device layers and they are not suitable in terms of efficiency and thermal budget, due to the lower reactivity of the thermally activated species. Additionally, a plasma process which can provide a more complete solution and capability in terms of growth/deposition of novel film structures, oxidation, hydrogenation, particle size creation and control, and independent control of plasma density and ion energy, and large area processing is desired for the development of high performance optoelectronic devices. Also, it is important to correlate the plasma process with the thin film properties as the various plasma parameters dictate the thin film properties and the desired film quality depends on the target application. Some of the key plasma and thin-film characteristics that depend on the target application are deposition rate, temperature, thermal budget, density, microstructure, interface quality, impurities, plasma-induced damage, state of the plasma generated active species (radicals/ions), plasma potential, process and system scaling, and electrical quality, and reliability. A correlation among these parameters is critical to evaluate the film quality as the process map will dictate the film quality for the target application. It may not be possible to learn or develop thin-films by just extending the processes developed in low density plasma or other high-density plasma systems, as the plasma energy, composition (radical to ions), plasma potential, electron temperature, and thermal conditions correlate differently depending on the process map.

Low temperatures are generally desirable in liquid crystal display (LCD) manufacture, where large-scale devices are formed on transparent glass, quartz, or plastic substrate. These transparent substrates can be damaged when exposed to temperatures exceeding 650 degrees C. To address this temperature issue, low-temperature Si oxidation processes have been developed. These processes use a high-density plasma source such as an inductively coupled plasma (ICP) source, and are able to form Si oxide with a quality comparable to 1200 degree C. thermal oxidation methods.

It would be advantageous if the advantages realized with high-density plasma SiOx films could be extended to a broader range of materials.

It would be advantageous if a low-temperature process existed for the fabrication of non-stoichiometric silicon-oxide-nitride thin-films with controlled optical characteristics.

SUMMARY OF THE INVENTION

The present invention describes a novel high-density plasma technique for the fabrication of stoichiometric, as well as non-stoichiometric $SiO_XN_Y$ ($X+Y<2$, and $Y>0$) thin films for novel optical devices. The HDP plasma processed $SiO_XN_Y$ thin-films may be embedded with nc-Si, and show a wide optical dispersion depending on the processing conditions. Like nc-Si embedded SiO2 films, it is possible to vary the refractive index (n) and the extinction constant (k) of nc-Si embedded SiOxNy thin-films in the range of 1.46-2.2 and 0-0.5, respectively, which overlaps the optical characteristics of various dielectric and semi conducting materials conventionally used for the fabrication of optical devices. In addition, the HDP plasma process enables the independent control of the n and k values, which can be successfully exploited for the fabrication of novel devices with wide process margins.

Accordingly, a high-density plasma method is provided for forming a $SiO_XN_Y$ thin-film. The method provides a substrate and introduces a silicon (Si) precursor. A thin-film is deposited overlying the substrate, using a high density (HD) plasma-enhanced chemical vapor deposition (PECVD) process. As a result, a $SiO_XN_Y$ thin-film is formed, where ($X+Y<2$ and $Y>0$). The $SiO_XN_Y$ thin-film can be stoichiometric or non-stoichiometric. The $SiO_XN_Y$ thin-film can be graded, meaning the values of X and Y vary with the thickness of the $SiO_XN_Y$ thin-film. Further, the process enables the in-situ deposition of a $SiO_XN_Y$ thin-film multilayer structure, where the different layers may be stoichiometric, non-stoichiometric, graded, and combinations of the above-mentioned types of $SiO_XN_Y$ or Si-containing thin-films.

In one aspect, the HD PECVD process is enabled with an inductively coupled plasma (ICP) source, and the substrate is heated to a temperature of less than about 400° C. Typically, an oxygen and nitrogen source gases are introduced with the Si precursor. In other aspects, hydrogen and inert gases are also introduced. The refractive index (n) of the $SiO_XN_Y$ thin-film can be increased in response to increasing the ratio of hydrogen to silicon precursor. The refractive index of the $SiO_XN_Y$ thin film can also be increased in response to increasing the ratio of noble gas to silicon precursor, or in response to decreasing the RF power used in the HD PECVD process.

Additional details of the above-described method are presented below.

DETAILED DESCRIPTION $SiO_XN_Y$, both stoichiometric and Si rich (non-stoichiometric) films, can be fabricated using a high-density plasma (HDP) process, with many similarities to the processes previously presented in parent application Ser. No. 11/418,273. The process enables the fabrication of many possible device structure combinations, both single and multilayer, including the following materials: nc-Si embedded $SiO_X$, $SiN_X$, $SiO_2$, $Si_3N_4$, and non-stoichiometric $SiO_XN_Y$ ($X+Y<2$, and Y is greater than 0). The Si-rich $SiO_X$ or $SiO_XN_Y$ films can be fabricated under similar power/pressure range as described previously for $SiO_X$ films, however, the precursors are different.

A non-stoichiometric $SiO_XN_Y$ thin-film, as used herein, is understood to be a film with nanocrystalline (nc) Si particles, and may also be referred to as a Si-rich $SiO_XN_Y$ thin-film. The term "non-stoichiometric" as used herein retains the meaning conventionally understood in the art as a chemical compound with an elemental composition that cannot be represented by a ratio of well-defined natural numbers and is, therefore, in violation of the law of definite proportions. Conventionally, a non-stoichiometric compound is a solid that is understood to include random defects, resulting in the deficiency of one element. Since the compound needs to be overall electrically neutral, the missing atom's charge needs to be compensated by a change in the charge for another atom in the compound (either by changing the oxidation state, or by replacing it with an atom of a different element with a different charge). More particularly, the "defect" in a non-stoichiometric $SiO_XN_Y$ involves nanocrystalline particles.

Table 1 lists some process parameters for forming HDP $Si_3N_4$ and nc-Si embedded $SiN_x$ thin-films.

TABLE 1

High-density plasma processing of $Si_3N_4$ and nc-Si embedded $SiN_x$ thin films

| | |
|---|---|
| Top Electrode Power | 13.56-300 MHz, up to 10 W/cm², |
| Bottom Electrode Power | 50 KHz-13.56 MHz, up to 3 W/cm² |
| Pressure | 1-500 mTorr |
| Gases: general | Any suitable precursor for Si + Source of Nitrogen: $N_2$, $NH_3$ + Inert Gas + $H_2$ |
| Our Investigation | $SiH_4$ + $N_2$ |
| Temperature | 25-400° C. |
| Film Thickness | 5 nm-1 μm |

A nc-Si embedded (non-stoichiometric) $SiO_XN_Y$ thin-film can be fabricated using the parameters presented in Table 2.

TABLE 2

High-density plasma processing of $Si_3N_4$ and nc-Si embedded $SiN_XN_Y$ thin-films

| | |
|---|---|
| Top Electrode Power | 13.56-300 MHz, up to 10 W/cm², |
| Bottom Electrode Power | 50 KHz-13.56 MHz, up to 3 W/cm² |
| Pressure | 1-500 mTorr |
| Gases: general | Any suitable precursor for Si + Source of Oxygen: $O_2$, $N_2O$ Source of Nitrogen: $N_2$, $NH_3$ + Inert Gas (Noble gases He, Ar, Kr, etc.) + Other Gases: $H_2$ |
| Temperature | 25-400° C. |
| Film Thickness | 5 nm-1 μm |

Various factors influence the refractive index of the films. For $SiO_X$ or $SiO_XN_Y$ films, some variables include the ratio of silane to oxygen source gas and/or nitrogen source gas. While HDP process SiOx thin-films have a refractive index limited to the range of 1.6-2.2, non-stoichiometric SiOxNy thin-films can be fabricated in a range of about 1.46-3.0. The extinction coefficient value of these non-stoichiometric SiOxNy thin-films can be in the range of about 0-0.5.

The optical dispersion characteristics of stoichiometric and S-rich films are quite different. So a combination of the two provides a wider range of n and k values, with more functionality for diverse optical applications. For example, the wider range of n and k values provides greater control over wavelength-related characteristics.

The HDP processed SiOxNy thin-films can be integrated on a wide variety of substrates made from semiconductor, dielectric, or metal materials. For example, the substrates may be quartz, glass, silicon, Ge, $Si_xGe_{1-x}$, SOI, SiC, ZnO, $Al_2O_3$, wide band gap semiconductors (InP, GaN, SiC, GaAs, etc.), plastic, and ceramic.

Depending on the target application, the refractive index of the HDP processed films can be changed by controlling the HDP process parameters. For example, the refractive index can be varied across the film thickness by controlling the process parameters. Using this concept, an interference filter optical device can be formed. Instead of using multilayer structures made of various materials to achieve the desired optical effect, as is conventional, the HDP process can be used for the fabrication of a graded refractive index structure. A graded refractive index structure includes a SiOxNy thin-film where the values of X and Y vary with film thickness. Further, even if the optical device is made in combination with other materials, the use of HDP processed SiOxNy thin-films improves the range and control over optical constants (n and k). The reflectance or transmission properties of the filters can be controlled by controlling the refractive index contrast between the constituent layers and the substrate.

The HDP processed SiOxNy thin-films can be deposited on transparent substrates to exploit their transmission characteristics. If the SiOxNy thin-films are used to enable light emitting devices, then the intensity of the emitted light can be controlled by the modifying the nanocrystalline Si (nc-Si) particle sizes. The PL emission of the non-stoichiometric $SiO_XN_Y$ thin-films covers the visible optical spectrum from 500-900 nanometers (nm). The emitted light intensity can be further controlled by doping the films to cover a wide wavelength range extending from UV to far IR wavelengths.

The HDP process can be used for the sequential deposition of the Si, $SiO_2$, $Si_3N_4$, $SiO_XN_Y$, Si-rich $SiO_XN_Y$ films in any order or combination, to exploit the refractive index contrast between the various layers. The above-mentioned layers can all be processed at temperatures below 400° C. The above-mentioned layers can also be combined with dielectric, semiconductor, and/or insulators to vary the optical dispersion characteristics.

One approach for controlling or obtaining the desired optical effect is to use very thin layers of optical materials with high refractive index contrast. This concept works effectively when the thickness of the layers is smaller than the wavelength of the light. For example, $Al_2O_3$ (n=1.62) and $TiO_2$ (n=2.2) can be used to control the refractive index in the range of 1.6-2.2. The same effect can be achieved in the present invention by varying the process variables to form layers of stoichiometric and non-stoichiometric $SiO_XN_Y$ thin-films.

The aspect of tunable optical dispersion characteristics can also be exploited to fabricate anti-reflection coatings (ARCs). If the substrate refractive index is $n_s$, the overlying the non-stoichiometric $SiO_XN_Y$ thin-film overlayer refractive index can be made $(n_s)^{-2}$. If the top layer is not air and has a refractive index of $n_o$, then the refractive index of the non-stoichiometric $SiO_XN_Y$ thin-film can be made $(n_o n_s)^{-2}$. The present films can function as anti-reflection coating on a wide variety of substrates. The wide range of the refractive indexes made possible by the present invention films enable the fabrication of multilayer ARCs with wide band absorption of incident wavelengths. By arranging the various layers in horizontal or vertical configurations, light can be guided in different directions.

More specifically, the optical devices may be grouped into two major categories: devices in which the light travels parallel to the plane of the substrate with the non-stoichiometric $SiO_XN_Y$ thin-films acting as waveguide, and devices in which the light travels perpendicular to the film plane, for use as anti-reflection coating, filters, mirrors, beam splitters. Non-stoichiometric $SiO_XN_Y$ thin-film devices can be made that act as a beamsplitter or light wavelength low pass, high pass, band pass, and shaped response filters.

Figure 1A:
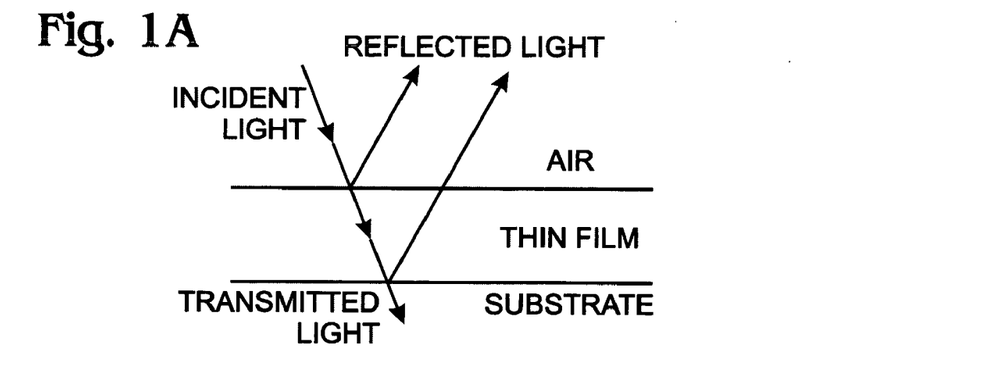
FIGS. 1A and 1B depict the reflection of light in single and multilayer thin-film structures, respectively.
Figure 1B:
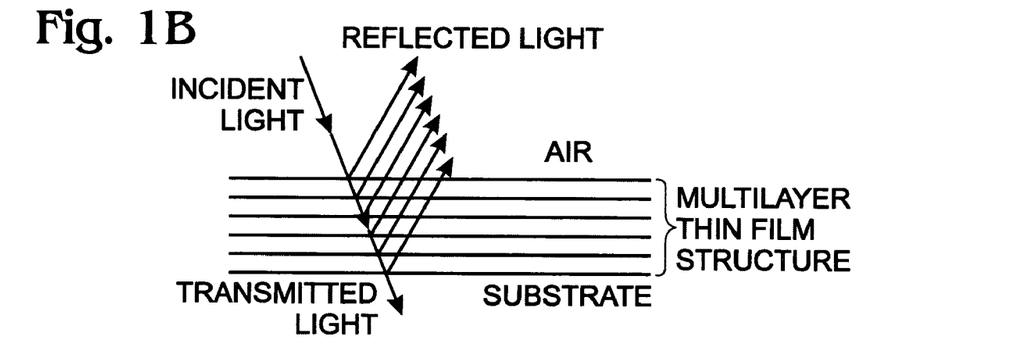

FIGS. 1A and 1B depict the reflection of light in single and multilayer thin-film structures, respectively. The contrast between the refractive index of the adjacent film layers can be employed to control the reflectance, transmittance, and absorption of the incident radiation.

The selection of the thin films for optoelectronic applications is also dependent upon film electrical, mechanical, and chemical properties. Thin-film characteristics such as microstructure, grain size, composition, density, defects and impurities, structural homogeneity, and interfacial characteristics are strongly influenced by the deposition technique and process parameters. This invention describes the novel high-density plasma processing of stoichiometric and non-stoichiometric $SiO_XN_Y$ thin-films. The HDP technique is suitable for the fabrication of high quality thin films due to high plasma density, low plasma potential, and independent control of plasma energy and density. The HDP technique is also attractive for the fabrication high quality films with minimal process or system induced impurity content. The HDP processed films exhibit superior bulk and interfacial characteristics due to minimal plasma-induced structural damage and process induced impurities. as compared to conventional plasma based deposition techniques such sputtering, ion beam deposition, CCP source based PECVD, and hot-wire CVD.

The HDP process can also be used to create nano-Si particles in $SiO_XN_Y$ films, even in the as-deposited state. The nc-Si particle concentration is further enhanced by post-deposition annealing and defect passivation treatments. The HDP processed nc-Si embedded $SiO_XN_Y$ films show tunable optical dispersion characteristics that can be exploited for the fabrication of novel optoelectronic devices.

Another aspect of the nc-Si embedded $SiO_XN_Y$ films is significant PL emission in the visible part of the spectrum, which can be used for the fabrication of active optical devices exhibiting signal gain and wavelength tuning. The optical characteristics of the HDP processed thin films can be further tuned by doping suitable impurities to control the optical response extending on either side of the visible spectrum, i.e., deep UV to far IR. The HDP technique is also suitable for low temperature and low thermal budget defect passivation of the films for enhanced electrical and optical response.

Figure 2:
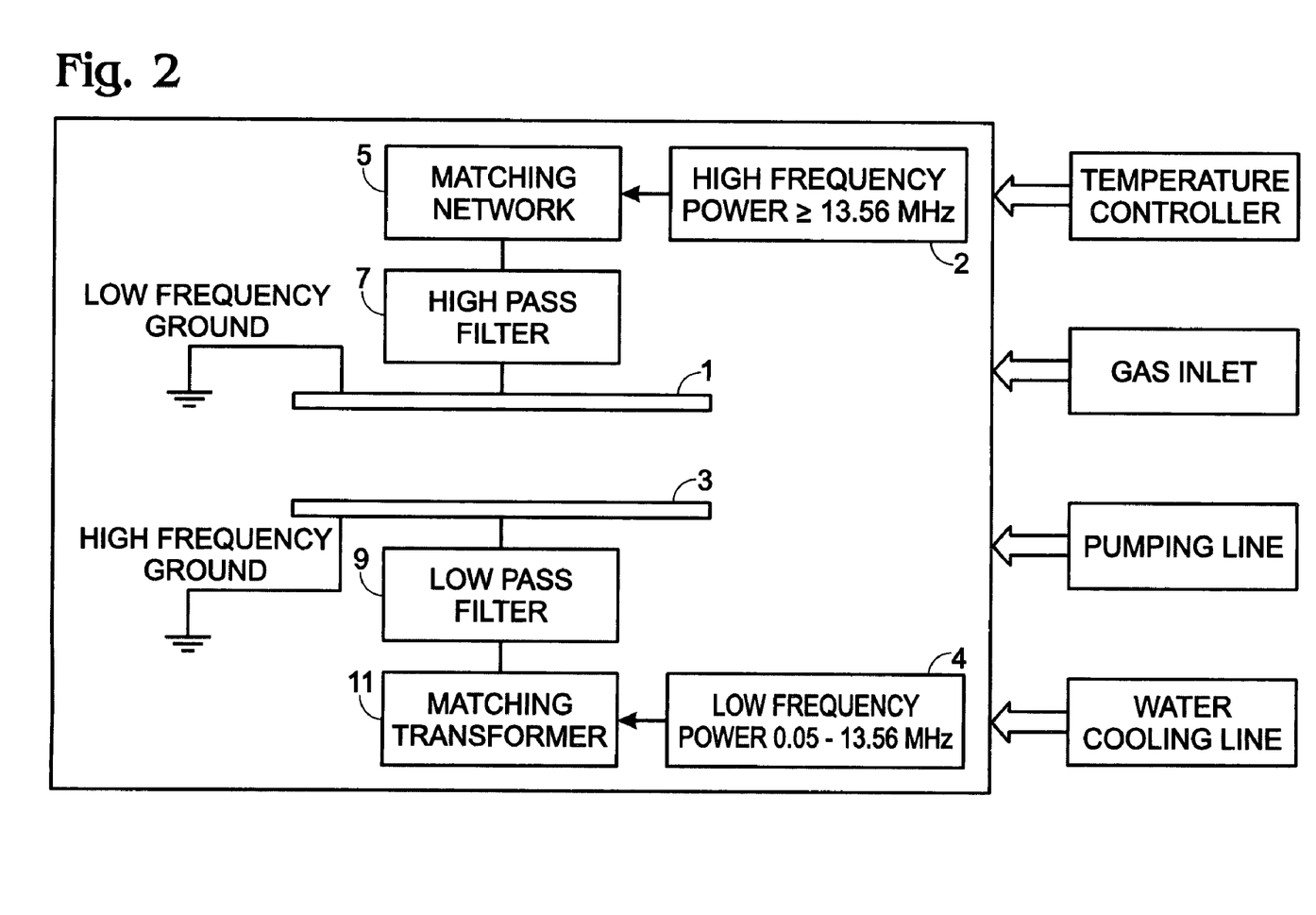
FIG. 2 is a schematic drawing of a high-density plasma (HDP) system with an inductively coupled plasma source.

FIG. 2 is a schematic drawing of a high-density plasma (HDP) system with an inductively coupled plasma source. The top electrode 1 is driven by a high frequency radio frequency (RF) source 2, while the bottom electrode 3 is driven by a lower frequency power source 4. The RF power is coupled to the top electrode 1, from the high-density inductively coupled plasma (ICP) source 2, through a matching network 5 and high pass filter 7. The power to the bottom electrode 3, through a low pass filter 9 and matching transformer 11, can be varied independently of the top electrode 1. The top electrode power frequency can be in the range of about 13.56 to about 300 megahertz (MHz) depending on the ICP design. The bottom electrode power frequency can be varied in the range of about 50 kilohertz (KHz) to about 13.56 MHz, to control the ion energy. The pressure can be varied up to 500 mTorr. The top electrode power can be as great as about 10 watts per square-centimeter ($W/cm^2$), while the bottom electrode power can be as great as about 3 $W/cm^2$.

One interesting feature of the HDP system is that there are no inductive coils exposed to the plasma, which eliminates any source-induced impurities. The power to the top and bottom electrodes can be controlled independently. There is no need to adjust the system body potential using a variable capacitor, as the electrodes are not exposed to the plasma. That is, there is no crosstalk between the top and bottom electrode powers, and the plasma potential is low, typically less than 20 V. System body potential is a floating type of potential, dependent on the system design and the nature of the power coupling.

The HDP tool is a true high-density plasma process with an electron concentration of greater than $1 \times 10^{11}$ $cm^{-3}$, and the electron temperature is less than 10 eV. There is no need to maintain a bias differential between the capacitor connected to the top electrode and the system body, as in many high-density plasma systems and conventional designs such as capacitively-coupled plasma tools. Alternately stated, both the top and bottom electrodes receive RF and low frequency (LF) powers.

Using the system shown in FIG. 2, high quality stoichiometric $SiO_XN_Y$ (X+Y=2) and non-stoichiometric $SiO_XN_Y$ thin-films (X+Y<2) can be processed by HDP technique at process temperatures below 400° C. The HDP technique is suitable for the fabrication of high quality thin films with a dense microstructure, low impurity content, and minimal plasma induced device damage, which are critical for the fabrication of high performance, and stable and reliable optical devices. The HDP processed films can be deposited on any suitable substrate, or be a part of a multilayer structure for the fabrication of novel devices exploiting the refractive index, band gap, absorption coefficient, PL/EL emission characteristics of the pure or doped films. Some of the substrates that are suitable for integrated optical devices are Si, Ge, Glass, Quartz, SiC, GaN, $Si_xGe_{1-x}$. The HDP processed films can be doped in-situ by adding a dopant source gas or incorporating physical sputtering source in the chamber along with the high-density PECVD setup. The optical properties of the HDP processed films can also be modified by implanting dopant species. The typical process conditions for the fabrication of stoichiometric $SiO_XN_Y$ and non-stoichiometric $SiO_XN_Y$ thin-films by HD-PECVD technique are listed in Table III.

TABLE III

| | |
|---|---|
| Top Electrode Power | 13.56-300 MHz, up to 10 $W/cm^2$, |
| Bottom Electrode Power | 50 KHz-13.56 MHz, up to 3 $W/cm^2$ |
| Pressure | 1-500 mTorr |
| Si source | Any suitable Si precursor ($SiH_4$, $Si_2H_6$, TEOS, etc.) |
| | Our Case: $SiH_4$ |
| Oxygen Source | Any suitable source of oxygen: ($O_2$, $O_3$, NO, $N_2O$ etc.) |
| Nitrogen Source | Any suitable source of nitrogen ($NH_3$, $N_2$, etc.) |
| Inert Gases ion the plasma | Any suitable inert gas: Noble gases, $N_2$, etc. |
| nc-Si particle creation and defect passivation | nc-Si particles: Silicon source + Oxygen source + inert gases + $H_2$ |
| | Passivation: Source of hydrogen ($NH_3$, $H_2$, etc.) |
| Temperature | 25-400° C. |

Figure 3A:
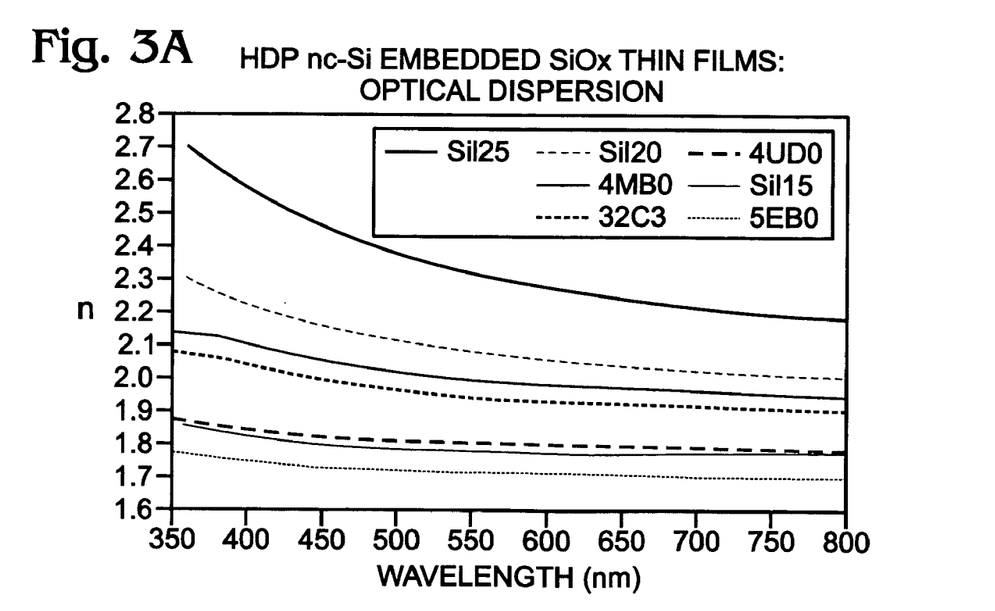
FIGS. 3A and 3B depict the optical dispersion characteristics of nc-Si embedded $SiO_X$ thin films.
Figure 3B:
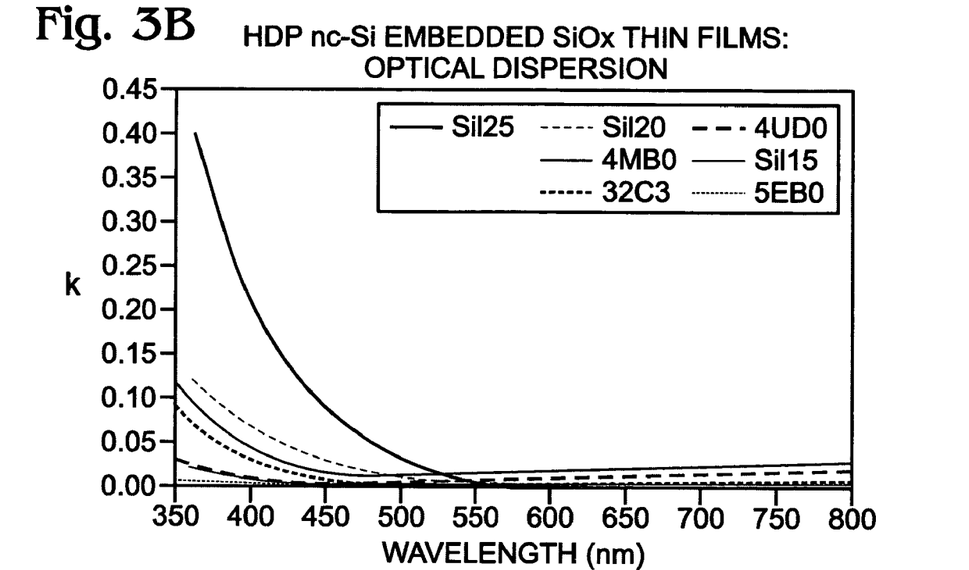

FIGS. 3A and 3B depict the optical dispersion characteristics of nc-Si embedded $SiO_X$ thin films. Generally, it is also known that the addition of N to a SiOx matrix leads to increases in the refractive index value. It is likely that even higher refractive indexes can be obtained for non-stoichiometric $Si_3N_4$ films. It is possible to tune the refractive index and the extinction coefficient of the films independently. The optical absorption edge of the films can also be effectively controlled by varying the thin film composition and the nc-Si particle size.

Figure 4A:
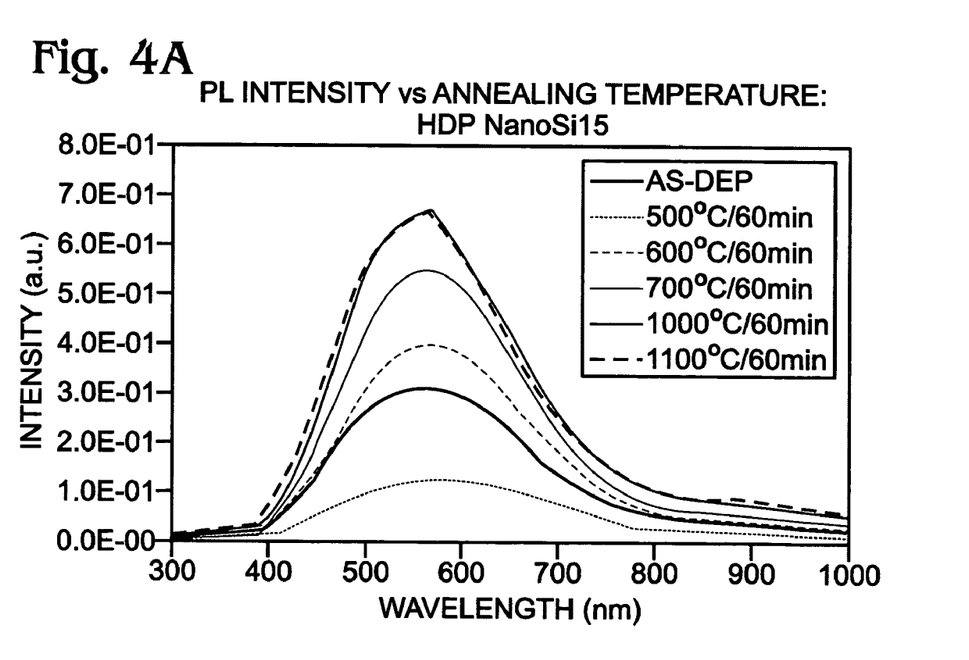
FIGS. 4A through 4C depict the PL emission characteristics of non-stoichiometric $SiO_X$ thin-films at different annealing temperatures.
Figure 4B:
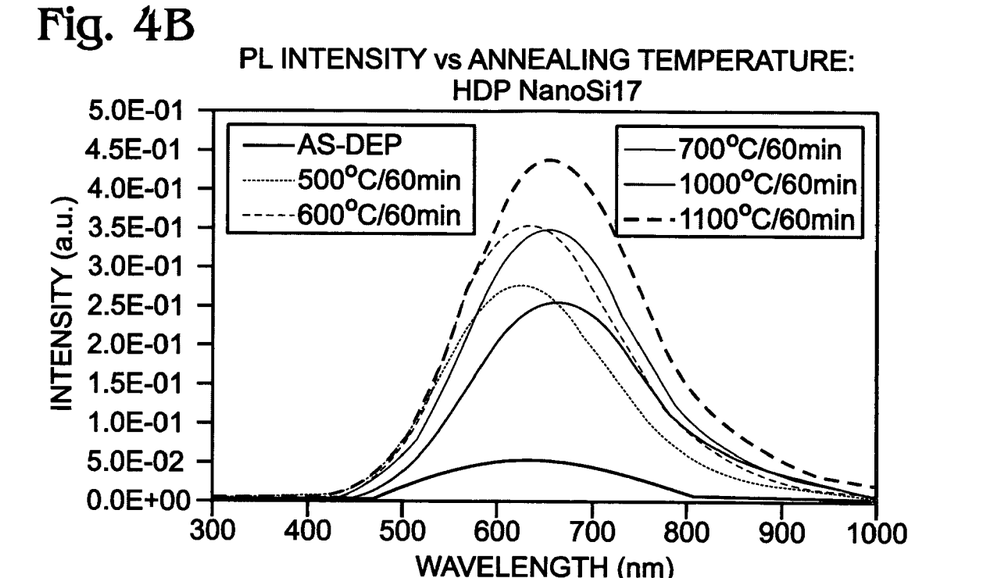
Figure 4C:
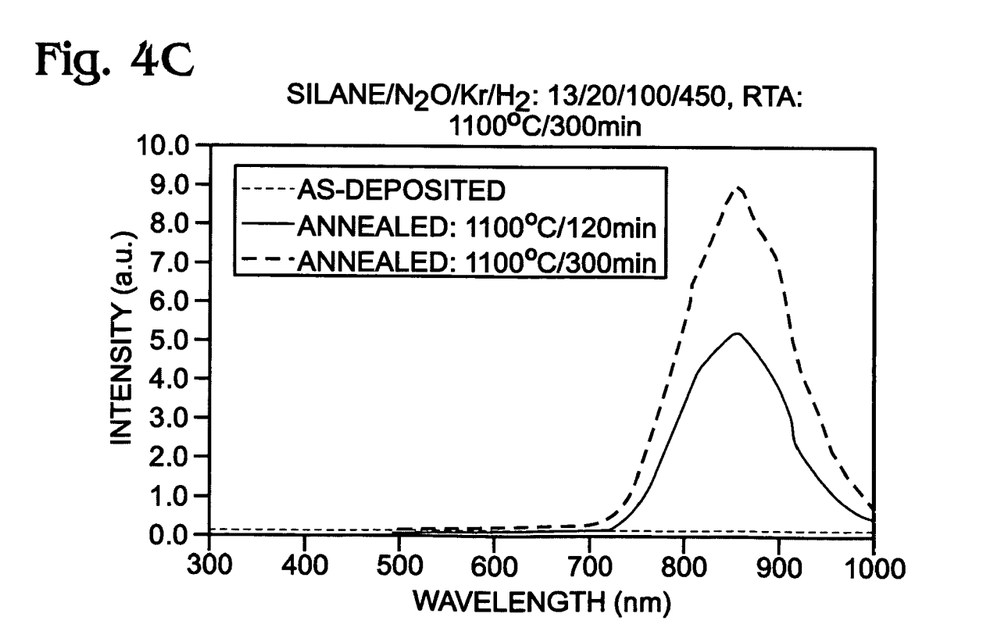

FIGS. 4A through 4C depict the PL emission characteristics of non-stoichiometric $SiO_X$ thin-films at different annealing temperatures. The depicted relationships are also applicable to nc-Si embedded SiOxNy thin films. The emitted wavelength depends strongly on the particle size. The HDP plasma process is efficient in the controlling the particle size over a wide range covering the entire visible spectrum. The HDP process is effective in the creation of the nc-Si particles at a low process temperature of 300° C. as is evident in the appreciable PL signal. The PL emission intensity is significantly enhanced by post-deposition annealing treatment at higher temperatures, due to phase separation and quantum confinement effects. Additionally, the HDP technique is also suitable for the low temperature and low thermal budget defect passivation.

Figure 5:
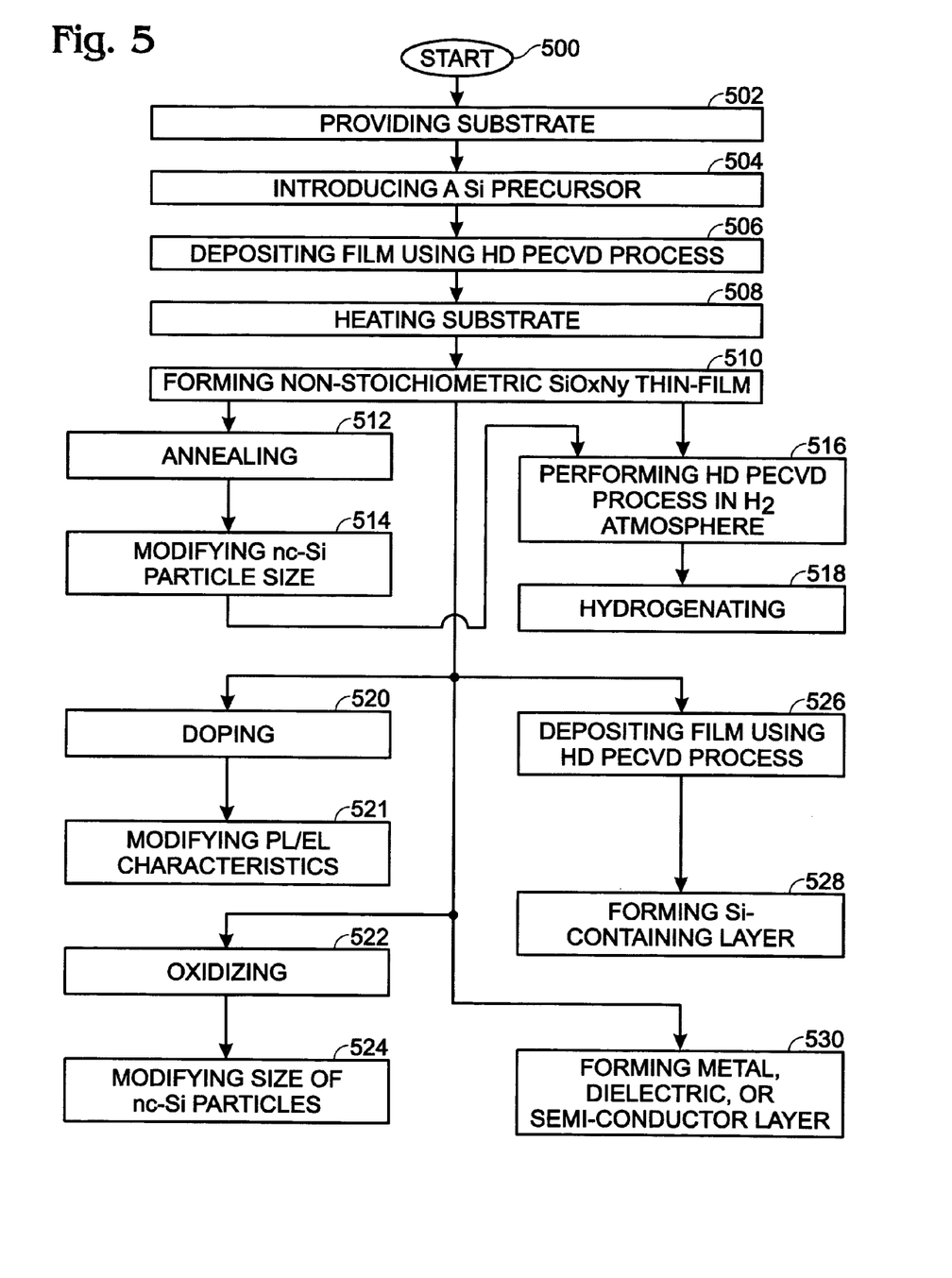
FIG. 5 is a flowchart illustrating a high-density plasma method for forming a non-stoichiometric $SiO_XN_Y$ thin-film.

FIG. 5 is a flowchart illustrating a high-density plasma method for forming a non-stoichiometric $SiO_XN_Y$ thin-film. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 500.

Step 502 provides a substrate. For example, the substrate can be a material such as plastic, glass, quartz, ceramic, metal, polymer, undoped Si, doped Si, SiC, Ge, $Si_{1-x}Ge_x$, silicon-containing materials, and semiconductor materials. However, other materials are also possible. Step 504 introduces a silicon (Si) precursor. The silicon precursor may be $Si_2H_6$, dichlorosilane, TEOS (tetra-ethoxy ortho-silicate), or $SiH_4$. Step 506 deposits a thin-film overlying the substrate, using a high density (HD) plasma-enhanced chemical vapor deposition (PECVD) process. In one aspect, an inductively coupled plasma (ICP) source is used. Alternately, a microwave slot antenna, a hollow cathode, an electron cyclotron resonance (ECR) plasma source, or a cathode-coupled plasma source can be used. The HD PECVD process typically uses a plasma concentration of greater than $1\times10^{11}$ $cm^{-3}$, with an electron temperature of less than 10 eV.

Step 508 heats the substrate to a temperature of less than about 400° C. Step 510 forms a non-stoichiometric $SiO_XN_Y$ thin-film, where (X+Y<2 and Y>0). Generally, a non-stoichiometric $SiO_XN_Y$ thin-film can be formed with a refractive index in the range of about 1.46 to 3, and an extinction coefficient (k) in the range of 0 to 0.5.

In one aspect, depositing the thin film includes using the HD PECVD process in Step 506 includes substeps (not shown). Step 506a supplies power to a top electrode at a frequency in the range of 13.56 to 300 megahertz (MHz), and a power density of up to 10 watts per square centimeter ($W/cm^2$). Step 506b supplies power to a bottom electrode at a frequency in the range of 50 kilohertz to 13.56 MHz, and a power density of up to 3 $W/cm^2$. Step 506c uses an atmosphere pressure in the range of 1 to 500 mTorr, and Step 506d supplies an oxygen source gas. For example, the oxygen source gas can be $N_2O$, NO, $O_2$, or $O_3$. In one aspect, Step 506d supplies a ratio of silane to oxygen source gas in the range of about 0.1 to 10.

In another aspect, Step 506d further supplies a nitrogen source gas such as $N_2$ and $NH_3$, where the ratio of nitrogen source gas to silicon precursor is in the range of about 0.01 to 20. In a different aspect, Step 506d further supplies a noble gas, where the ratio of noble gas to silicon precursor is in the range of about 0.02 to 10. In response to increasing the ratio of noble gas to silicon precursor, Step 510 increases the refractive index of the non-stoichiometric $SiO_XN_Y$ thin film.

In one aspect, supplying the oxygen source gas in Step 506d further includes supplying a He gas, where the ratio of He gas to silicon precursor is in the range of about 0.02 to 100.

In one aspect, Step 506d supplies a hydrogen source gas, in addition to an oxygen source gas. In addition to the hydrogen source gas, an inert gas such as $N_2$, He, Ar, or Kr may be supplied. $NH_3$ can be used to supply both the hydrogen and inert gas. In one aspect, Step 506d supplies oxygen source gas and inert gas in a ratio in the range of about 0.02 to 5. In a different aspect, an oxygen source gas and hydrogen gas are supplied in a ratio of about 0.01 to 20. Step 506d may also supply inert gas and hydrogen gas in a ratio in the range of about 0.01 to 40. In one aspect, Step 510 increases the refractive index (n) of the non-stoichiometric $SiO_XN_Y$ thin-film in response to increasing the ratio of hydrogen to silicon precursor.

In one aspect, Step 506a decreases the RF power to the top electrode. Then, Step 510 increases the refractive index of the non-stoichiometric $SiO_XN_Y$ thin-film in response to decreasing the RF power.

In another aspect, supplying the oxygen source gas in Step 506d includes increasing the ratio of silicon precursor to oxygen source gas. Then, Step 510 increases the refractive index of the non-stoichiometric $SiO_XN_Y$ thin-film in response to increasing the silicon precursor/oxygen source gas ratio.

In one aspect, following the formation of the non-stoichiometric $SiO_XN_Y$ thin-film, Step 512 anneals by heating the substrate to a temperature of greater than about 400° C., for a time duration in the range of about 10 to 300 minutes, in an atmosphere including oxygen and inert gases. Then, Step 514 modifies the size of nanocrystalline Si particles in the non-stoichiometric $SiO_XN_Y$ thin-film in response to the annealing. For example, the annealing can be accomplished using a heat source having a radiation wavelength in the range of about 200 to 600 nanometers (nm), or 9 to 11 micrometers. Preferably, Steps 516 and 518 (as explained below) are performed after Steps 512 and 514.

In a different aspect, Steps 516 and 518 are performed without the performance of Steps 512 and 514. Step 516 performs a HD plasma treatment with the non-stoichiometric $SiO_XN_Y$ thin-film in an $H_2$ atmosphere, using a substrate temperature of less than 400° C. As a result, Step 518 hydrogenates the non-stoichiometric $SiO_XN_Y$ thin-film. Hydrogentating the non-stoichiometric $SiO_XN_Y$ thin film using the HD plasma process may include substeps (not shown). Step 516a supplies power to a top electrode at a frequency in the range of 13.56 to 300 MHz, and a power density of up to 10 $W/cm^2$. Step 516b supplies power to a bottom electrode at a frequency in the range of 50 kilohertz to 13.56 MHz, and a power density of up to 3 $W/cm^2$. Step 516c uses an atmosphere pressure in the range of 1 to 500 mTorr, and Step 516d supplies $H_2$ and an inert gas.

In one variation, Step 520 dopes the non-stoichiometric $SiO_XN_Y$ thin-film with a dopant such as a Type 3, Type 4, Type 5, or rare earth element. In response to doping, Step 521 forms a non-stoichiometric SiOxNy thin-film with photoluminescent (PL) and electroluminescent (EL) characteristics that are modified from the visible light characteristics shown in FIGS. 4A-4C, to be in the wider range of frequencies, from deep ultraviolet (UV) to far infrared (IR).

In another variation, following the formation of the non-stoichiometric $SiO_XN_Y$ thin-film, Step 522 oxidizes the non-stoichiometric $SiO_XN_Y$ thin-film using a plasma or thermal oxidation process. Step 524 modifies the size of nanocrystalline Si particles in the non-stoichiometric $SiO_XN_Y$ thin-film in response to the oxidation process.

In another aspect, depositing a thin-film overlying the substrate in Step 506 includes varying the HD PECVD process conditions during deposition. Then, Step 510 forms a non-stoichiometric $SiO_XN_Y$ thin-film with values of X and Y that vary with respect to the thickness of the thin-film. For example, the X or Y values, or just one of the values may consistently increase or decrease as the film thickness increases. In another aspect, the X and Y values, or just one of the values may initially move in one direction (e.g., increase) as the film thickness increases, and then move in the opposite direction (e.g., decrease) once a threshold thickness is reached.

In another aspect, Step 526 uses an in-situ HD PECVD process to deposit a thin-film overlying the non-stoichiometric $SiO_XN_Y$ thin-film, and Step 528 forms a layer overlying the non-stoichiometric $SiO_XN_Y$ thin-film made from a material such as Si, $SiO_2$, $Si_3N_4$, stoichiometric $SiO_xN_y$, or (another) non-stoichiometric $SiO_xN_y$ film. Note: in this aspect multiple layers and combinations of the above-mentioned layers can be deposited above the non-stoichiometric $SiO_xN_y$ film. Although not specifically shown, any one, or any combination of the above-mentioned layers can be formed between the substrate and the non-stoichiometric $SiO_XN_Y$ film. In a different aspect, Step 530 forms a layer overlying the non-stoichiometric $SiO_XN_Y$ thin-film from a material such as metal, dielectric, or a semiconductor material. Although not specifically shown, any one, or any combination of the above-mentioned layers can be formed between the substrate and the non-stoichiometric $SiO_xN_y$ film.

A high-density PECVD method has been provided for the deposition of non-stoichiometric $SiO_xN_y$ film. Some details of specific materials and fabrication steps have been used to illustrate the invention. However, the invention is not limited to merely these examples. Other variations and embodiments of the invention will occur to those skilled in the art.

We claim:

1. A high-density plasma method for forming a non-stoichiometric $SiO_xN_y$ thin-film, the method comprising:
   providing a substrate;
   introducing a silicon (Si) precursor;
   depositing a thin-film overlying the substrate, using a high, density (HD) plasma-enhanced chemical vapor deposition (PECVD) process as follows:
      supplying power to a top electrode at a frequency in the range of 13.56 to 300 megahertz (MHz), and a power density of up to 10 watts per square centimeter (W/cm2);
      supplying power to a bottom electrode at a frequency in the range of 50 kilohertz to 13.56 MHz, and a power density of up to 3 W/cm2;
      using an atmospheric pressure in the range of 1 to 500 mTorr; and
      supplying an oxygen source gas selected from the group consisting of N2O, NO, O2, and O3, and a hydrogen source gas; and,
   forming a non-stoichiometric $SiO_xN_y$ thin-film with embedded nanocrystalline silicon, where (X+Y<2 and Y>0), as follows:
      in a first process performed on a first substrate, supplying the non-stoichiometric $SiO_xN_y$ thin-film with a first refractive index (n) responsive to a first ratio of hydrogen to silicon precursor; and,
      in a second process performed on a second substrate overlying the first substrate, increasing the refractive index (n) of the non-stoichiometric $SiO_xN_y$ thin-film, with respect to the first refractive index, in response to increasing the ratio of hydrogen to silicon precursor.

2. The method of claim 1 wherein depositing the thin film using an HD PECVD process includes using an inductively coupled plasma (ICP) source.

3. The method of claim 1 further comprising:
   heating the substrate to a temperature of less than about 400° C.

4. The method of claim 1 wherein the step of supplying the oxygen source gas and hydrogen source gas further includes additionally supplying an inert gas selected from the group consisting of $N_2$, He, Ar, and Kr.

5. The method of claim 4 wherein supplying the hydrogen source gas and inert gas includes supplying $NH_3$.

6. The method of claim 4 wherein supplying the oxygen source gas, hydrogen source gas, and inert gas includes supplying the oxygen source gas and inert gas in a ratio in the range of about 0.02 to 5.

7. The method of claim 4 wherein supplying the oxygen source gas, hydrogen source gas, and inert gas includes supplying the oxygen source gas and hydrogen source gas in a ratio in the range of about 0.01 to 20.

8. The method of claim 4 wherein supplying the oxygen source gas, hydrogen source gas, and inert gas includes supplying inert gas and hydrogen source gas in a ratio in the range of about 0.01 to 40.

9. The method of claim 1 wherein supplying the Si precursor includes supplying silane; and,
   wherein supplying the oxygen source gas includes supplying a ratio of silane to oxygen source gas in the range of about 0.1 to 10.

10. The method of claim 1 wherein supplying the oxygen source gas further includes additionally supplying a nitrogen source gas, selected from a group consisting of $N_2$ and $NH_3$, where the ratio of nitrogen source gas to silicon precursor is in the range of about 0.01 to 20.

11. The method of claim 1 wherein supplying the oxygen source gas further includes additionally supplying a noble gas, where the ratio of noble gas to silicon precursor is in the range of about 0.02 to 10.

12. The method of claim 11 wherein supplying the noble gas includes:
   in the first process performed on the first substrate, supplying a first ratio of noble gas to silicon precursor;
   in the second process performed on the second substrate, increasing the ratio of noble gas to silicon precursor with respect to the first ratio; and,
   wherein forming the non-stoichiometric $SiO_XN_Y$ includes:
   in the first process, supplying the non-stoichiometric $SiO_XN_Y$ thin film with the first refractive index; and,
   in the second process, increasing the refractive index of the non-stoichiometric $SiO_XN_Y$ thin film, with respect to the first refractive index, in response to increasing the ratio of noble gas to silicon precursor.

13. The method of claim 1 wherein supplying the oxygen source gas further includes additionally supplying a He gas, where the ratio of He gas to silicon precursor is in the range of about 0.02 to 100.

14. The method of claim 1 wherein supplying the Si precursor includes supplying a silicon precursor selected from the group consisting of Si2H6, dichlorosilane, TEOS (tetraethoxy ortho-silicate), and SiH4.

15. The method of claim 1 wherein supplying power to the top electrode includes:
   in the first process performed on the first substrate, supplying a first RF power to the top electrode;
   in the second process performed on the second substrate, decreasing the RF power to the top electrode with respect to the first RF power; and, wherein forming the non-stoichiometric $SiO_XN_Y$ thin-film includes:
in the first process, supplying the non-stoichiometric $SiO_XN_Y$ thin film with the first refractive index; and,
in the second process, increasing the refractive index of the non-stoichiometric $SiO_XN_Y$ thin-film, with respect to the first refractive index, in response to decreasing the RF power.

16. The method of claim 1 wherein supplying the oxygen source gas includes:
in the first process performed on the first substrate, supplying a first ratio of silicon precursor to oxygen source gas;
in the second process performed on the second substrate, increasing the ratio of silicon precursor to oxygen source gas, with respect to the first ratio; and,
wherein forming the non-stoichiometric $SiO_XN_Y$ thin-film with embedded nanocrystalline Si includes:
in the first process, supplying the non-stoichiometric $SiO_XN_Y$ thin film with the first refractive index; and,
in the second process, increasing the refractive index of the non-stoichiometric $SiO_XN_Y$ thin-film, with respect to the first refractive index, in response to increasing the silicon precursor/oxygen source gas ratio.

17. The method of claim 1 wherein forming the non-stoichiometric $SiO_XN_Y$ thin-film includes forming a non-stoichiometric $SiO_XN_Y$ thin-film with a refractive index in the range of about 1.46 to 3.

18. The method of claim 1 further comprising:
following the formation of the non-stoichiometric $SiO_XN_Y$ thin-film, annealing as follows:
heating the substrate to a temperature of greater than about 400° C.;
heating for a time duration in the range of about 10 to 300 minutes;
heating in an atmosphere including oxygen and insert gases; and,
modifying the size of nanocrystalline Si particles in the non-stoichiometric $SiO_XN_Y$ thin-film in response to the annealing.

19. The method of claim 1 further comprising:
following the formation of the non-stoichiometric $SiO_XN_Y$ thin-film, annealing using a heat source having a radiation wavelength selected from the group consisting of about 200 to 600 nanometers (nm) and 9 to 11 micrometers.

20. The method of claim 1 further comprising:
performing a HD plasma treatment with the non-stoichiometric $SiO_XN_Y$ thin-film in an H2 atmosphere, using a substrate temperature of less than 400° C.; and,
hydrogenating the non-stoichiometric $SiO_XN_Y$ thin-film.

21. The method of claim 20 wherein hydrogenating the non-stoichiometric $SiO_XN_Y$ thin film using the HD plasma process includes:
supplying power to a top electrode at a frequency in the range of 13.56 to 300 MHz, and a power density of up to 10 $W/cm^2$;
supplying power to a bottom electrode at a frequency in the range of 50 kilohertz to 13.56 MHz, and a power density of up to 3 $W/cm^2$;
using an atmosphere pressure in the range of 1 to 500 mTorr; and,
supplying H2 and an inert gas.

22. The method of claim 1 wherein depositing the thin-film using the HD PECVD process includes using a source selected from the group consisting of a microwave slot antenna, a hollow cathode, an electron cyclotron resonance (ECR) plasma source, and a cathode-coupled plasma source.

23. The method of claim 1 wherein forming the substrate includes forming a substrate from a material selected from the group consisting of plastic, glass, quartz, ceramic, metal, polymer, undoped Si, doped Si, SiC, Ge, $Si_{1-x}Ge$, silicon-containing materials, and semiconductor materials.

24. The method of claim 1 further comprising:
following the formation of the non-stoichiometric $SiO_XN_Y$ thin-film, oxidizing the non-stoichiometric $SiO_XN_Y$ thin-film using a process selected from the group consisting of plasma and thermal oxidation; and,
modifying the size of nanocrystalline Si particles in the non-stoichiometric $SiO_XN_Y$ thin-film in response to the oxidation process.

25. The method of claim 1 wherein depositing the thin-film using the HD PECVD process includes using a plasma concentration of greater than $1 \times 10^{11}$ $cm^{-3}$, with an electron temperature of less than 10 eV.

26. The method of claim 1 wherein forming the non-stoichiometric $SiO_XN_Y$ thin-film includes forming a non-stoichiometric $SiO_XN_Y$ with an extinction coefficient (k) in the range of 0 to 0.5.

27. The method of claim 1 wherein depositing a thin-film overlying the substrate using a HD PECVD process includes varying the process condition during deposition; and,
wherein forming the non-stoichiometric $SiO_XN_Y$ thin-film includes forming a non-stoichiometric $SiO_XN_Y$ thin-film with values of X and Y that vary with respect to the thickness of the thin-film.

28. The method of claim 1 further comprising:
using an in-situ HD PECVD process, depositing a thin-film overlying the non-stoichiometric $SiO_XN_Y$ thin-film; and,
forming a layer overlying the non-stoichiometric $SiO_XN_Y$ thin-film made from a material selected from a group consisting of Si, $SiO_2$, $Si_3N_4$, stoichiometric $SiO_XN_Y$, and non-stoichiometric $SiO_XN_Y$ films.

29. The method of claim 1 further comprising:
forming a layer overlying the non-stoichiometric $SiO_XN_Y$ thin-film from a material selected from the group consisting of metal, dielectric, and semiconductor material.

30. A high-density plasma method for forming a non-stoichiometric $SiO_XN_Y$ thin-film, the method comprising:
providing a substrate;
introducing a silicon (Si) precursor;
depositing a thin-film overlying the substrate, using a high density (HD) plasma-enhanced chemical, vapor deposition (PECVD) process; and,
forming a non-stoichiometric $SiO_XN_Y$ thin-film with embedded nanocrystalline silicon, where (X+Y<2 and Y>0),
doping the non-stoichiometric $SiO_XN_Y$ thin-film with a dopant selected from the group consisting of Group 3, Group 4, Group 5, and rare earth elements; and,
in response to doping, forming a non-stoichiometric SiOxNy thin-film with photoluminescent (PL) and electroluminescent (EL) characteristics in a range of frequencies from deep ultraviolet (UV) to far infrared (IR).

31. A high-density plasma method for forming a non-stoichiometric $SiO_XN_Y$ thin-film, the method comprising:
providing a substrate;
introducing a silicon (Si) precursor;
depositing a thin-film overlying the substrate, using a high density (HD) plasma-enhanced chemical vapor deposition (PECVD) process, as follows:
supplying power to a top electrode at a frequency in the range of 13.56 to 300 megahertz (MHz), and a power density of up to 10 watts per square centimeter ($W/cm^2$);

supplying power to a bottom electrode at a frequency in the range of 50 kilohertz to 13.56 MHz, and a power density of up to 3 W/cm$^2$;

using an atmosphere pressure in the range of 1 to 500 mTorr; and, supplying an oxygen source gas and a noble gas, where the ratio of the noble gas to silicon precursor is in the range of about 0.02 to 10, and where supplying the noble gas includes:

in a first process performed on a first substrate, supplying a first ratio of noble gas to silicon precursor;

in a second process performed on a second substrate overlying the first substrate, increasing the ratio of noble gas to silicon precursor with respect to the first ratio; and, forming a non-stoichiometric SiO$_X$N$_Y$ thin-film with embedded nanocrystalline silicon, where (X+Y<2 and Y>0), as follows:

in the first process, supplying the non-stoichiometric SiO$_X$N$_Y$ thin film with a first refractive index; and, in the second process, increasing the refractive index of the non-stoichiometric SiO$_X$N$_Y$ thin film, with respect to the first refractive index, in response to increasing the ratio of noble gas to silicon precursor.

32. The method of claim 31 wherein depositing the thin film using an HD PECVD process includes using an inductively coupled plasma (ICP) source.

33. The method of claim 32 wherein the step of supplying the oxygen source gas includes supplying an oxygen source gas from a source selected from the group consisting of N$_2$O, NO, O$_2$, and O$_3$.

34. The method of claim 33 wherein the step of supplying the oxygen source gas further includes supplying a hydrogen source gas.

35. The method of claim 31 further comprising:

heating the substrate to a temperature of less than about 400° C.

* * * * *